(12) United States Patent
Mizoguchi

(10) Patent No.: US 6,411,115 B2
(45) Date of Patent: *Jun. 25, 2002

(54) APPARATUS FOR TESTING A SEMICONDUCTOR AND PROCESS FOR THE SAME

(75) Inventor: Yuichi Mizoguchi, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/249,693

(22) Filed: Feb. 12, 1999

(30) Foreign Application Priority Data

Mar. 2, 1998 (JP) .......................... 10-049694

(51) Int. Cl.[7] .............................. G01R 31/02
(52) U.S. Cl. ..................................... 324/763
(58) Field of Search ........................ 324/158.1, 763, 324/765; 714/733, 734

(56) References Cited

U.S. PATENT DOCUMENTS

| | | | | |
|---|---|---|---|---|
| 3,849,872 A | * | 11/1974 | Hubacher | 438/17 |
| 4,843,314 A | * | 6/1989 | Barnaby | 324/158.1 |
| 5,164,663 A | * | 11/1992 | Alcorn | 714/734 |
| 5,442,282 A | * | 8/1995 | Rostoker et al. | 324/158.1 |
| 5,640,102 A | * | 6/1997 | Sato | 324/755 |
| 5,744,949 A | * | 4/1998 | Whetsel | 324/158.1 |
| 5,898,703 A | * | 4/1999 | Lin | 714/726 |

FOREIGN PATENT DOCUMENTS

| | | |
|---|---|---|
| JP | 9-26463 | 1/1997 |
| JP | 10-288647 | 10/1998 |

* cited by examiner

Primary Examiner—Michael J. Sherry
Assistant Examiner—Russell M. Kobert
(74) Attorney, Agent, or Firm—Scully, Scott, Murphy & Presser

(57) ABSTRACT

A a testing circuit for a semiconductor device comprising a plurality of external terminals; a plurality of external terminal wires, each of which is connected to one of the external terminals; a testing external terminal; a testing wire connected to the testing external terminal; a plurality of switches placed between the testing wire and the external terminal wires; and a control circuit for selecting one of the switches to bring it into conduct, in response to a test signal. Connection states of power and GND terminals can be conveniently tested and a highly reliable semiconductor device can be provided.

7 Claims, 4 Drawing Sheets

APPARATUS FOR TESTING A SEMICONDUCTOR AND PROCESS FOR THE SAME

BACKGROUND OF THE INVENTION

1. Field of the Invention

This invention relates to a testing circuit/method for a semiconductor device.

2. Description of the Related Art

There is a testing circuit/method called a boundary scan for testing connection of a semiconductor device with an external equipment or another semiconductor device. The boundary scan is a testing circuit/method for a semiconductor device provided in the IEEE Standard 1149.1.

The boundary scan testing circuit has the following control terminals; a clock terminal for the boundary scan testing, a terminal of a control register for controlling state transition in a test, serial data input terminals for individual data registers, an initialization terminal for the control register and serial data output terminals from individual data registers.

An exclusive buffer for the boundary scan testing circuit has a function of disconnecting with an internal circuit by the control register to present an output to the data register, or receiving the data set in the data register to output them to an external equipment. The exclusive buffer also has, besides data input/output, a function of forming a high impedance state.

The data register of the boundary scan testing circuit has a function of retaining data from the exclusive buffer register or data to the exclusive buffer by the control resister. Also, individual data registers are connected in serial to each other to transmit their data to a subsequent data register.

The control register of the boundary scan testing circuit controls the exclusive buffer and the data register for achieving a predetermined test mode.

A boundary-scan testing method using such a testing circuit sets measured data in a data register of a semiconductor device which is placed upstream of a tested semiconductor device and then performs observation with the data register of the tested semiconductor device for ensuring that correct data are transmitted.

The test method has the following states;

EXTEST mode for testing connection between semiconductor devices,

SAMPLE mode for measuring output data from a tested semiconductor device,

BYPASS mode for setting a test mode or data for the data register, skipping a given semiconductor device, and CLAMPIO mode for setting all output terminals of a semiconductor device to a high impedance state.

However, in the testing circuit of the prior art, an exclusive buffer and a data register are placed between an internal circuit of a tested semiconductor device and an external terminal. It can, therefore, test only signal terminals, but not whether power and GND terminals essential for operating the semiconductor device are correctly connected.

SUMMARY OF THE INVENTION

An objective of this invention is to provide a testing circuit/process for a semiconductor device, which can conveniently test connection states of power and GND terminals to improve reliability of the device.

This invention provides a testing circuit for a semiconductor device comprising a plurality of external terminals; a plurality of external terminal wires, each of which is connected to one of the external terminals; a testing external terminal; a testing wire connected to the testing external terminal; a plurality of switches placed between the testing wire and the external terminal wires; and a control circuit for selecting one of the switches to bring it into conduct, in response to a test signal.

This invention also provides a semiconductor device into which the above testing circuit is built.

This invention also provides a testing process for a semiconductor device into which the above testing circuit is built, comprising, when testing a power terminal as the external terminal, the steps of applying a lower voltage to the testing external terminal than that to the power terminal and bringing a selected switch corresponding the tested power terminal into conduct by the control circuit while measuring a potential of the tested external terminal, which are repeated for individual power terminals; and, when testing a GND terminal as the external terminal, the steps of applying a voltage to the testing external terminal and bringing a selected switch corresponding the tested GND terminal into conduct by the control circuit while measuring a potential of the tested external terminal, which are repeated for individual GND terminals.

This invention allows one to test whether power terminals of a semiconductor device are correctly connected. It is because a power wire is divided into parts corresponding to individual power terminals to permit a power terminal separated from an internal circuit to be freely selected and a potential of the tested external terminal may be measured to readily determine correctly and incorrectly connected terminals.

This invention also allows one to test whether GND terminals of the semiconductor device are correctly connected. It is because the GND wire is divided into parts corresponding to individual GND terminals to permit a GND terminal separated from an internal circuit to be freely selected and a potential of the tested external terminal may be measured to readily determine correctly and incorrectly connected terminals.

This invention also allows one to individually test and determine connection states for power or GND terminals. It is because the power or GND terminals which are usually connected through a common power or GND wire are separated to independently test each terminal.

DETAILED DESCRIPTION OF THE PREFERRED EMBODIMENTS

In an embodiment, this invention provides a testing circuit for a semiconductor device comprising a plurality of power terminals; a plurality of power wires, each of which is connected to one of the power terminals; a testing external terminal; a testing wire connected to the testing external terminal; a plurality of switches placed between the testing wire and the power wires; and a control circuit for selecting one of the switches to bring it into conduct, in response to a test signal.

In another embodiment, this invention provides a testing circuit for a semiconductor device comprising a plurality of GND terminals; a plurality of GND wires, each of which is connected to one of the GND terminals; a testing external terminal; a testing wire connected to the testing external terminal; a plurality of switches placed between the testing wire and the GND wires; and a control circuit for selecting one of the switches to bring it into conduct, in response to a test signal.

In a further embodiment, this invention provides a testing circuit for a semiconductor device comprising a plurality of power terminals; a plurality of power wires, each of which is connected to one of the power terminals; a plurality of GND terminals; a plurality of GND wires, each of which is connected to one of the GND terminals; a testing external terminal; a testing wire connected to the testing external terminal; a plurality of switches placed between the testing wire and at least either of the power wires or the GND wires; and a control circuit for selecting one of the switches to bring it into conduct, in response to a test signal.

With reference to the drawings, this invention will be described in detail.

Figure 1:
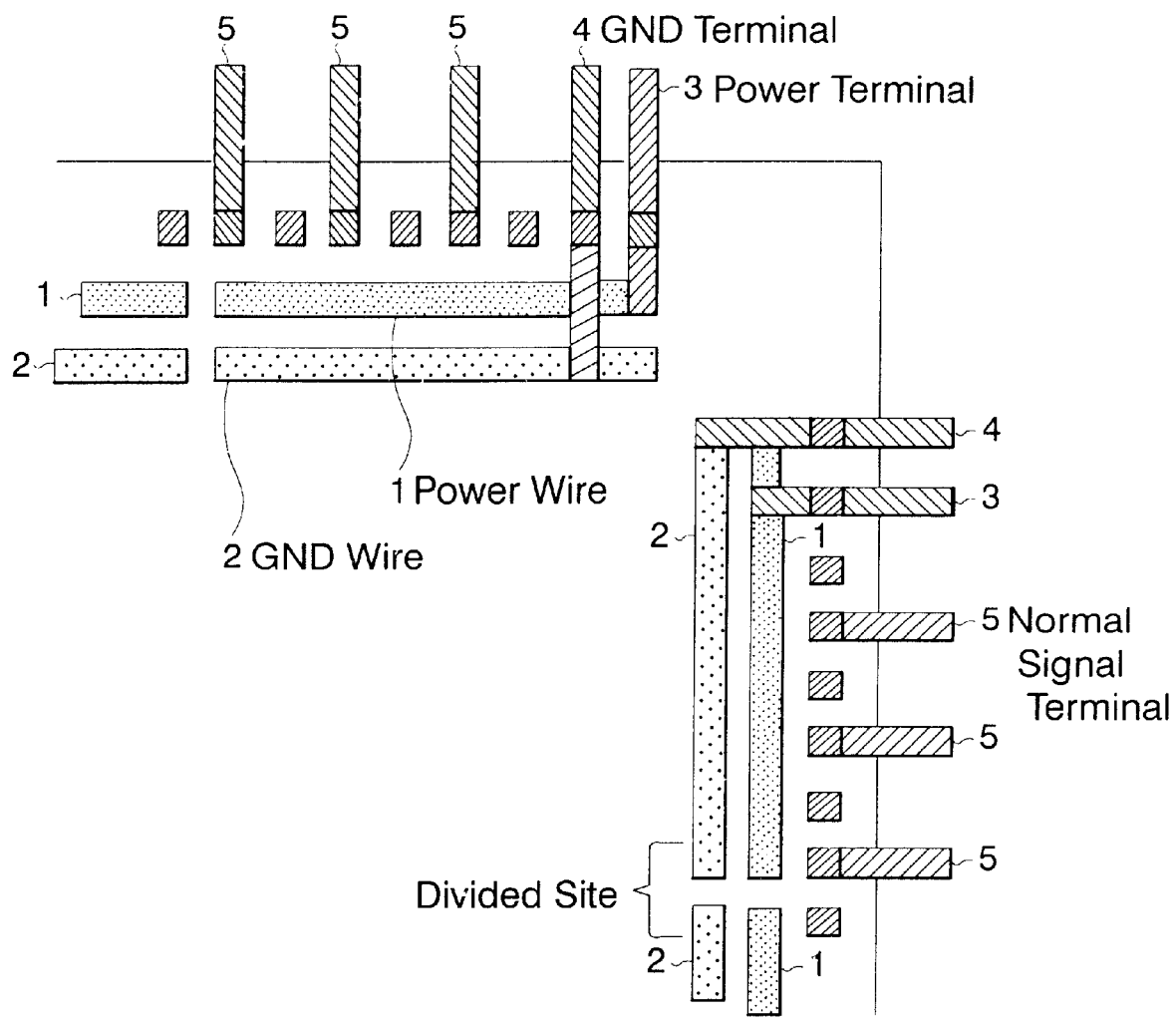
FIG. 1 is an explanatory drawing for a testing circuit for a semiconductor device according to this invention.

As shown in FIG. 1, power wires 1 and GND wires 2 placed on a semiconductor device are appropriately divided. The separated power wires 1 and GND wires 2 are connected to power terminals 3 and GND terminals 4, respectively. It allows tested power and GND terminals to be appropriately separated. In this figure, the symbol 5 represents a normal signal terminal.

Figure 2:
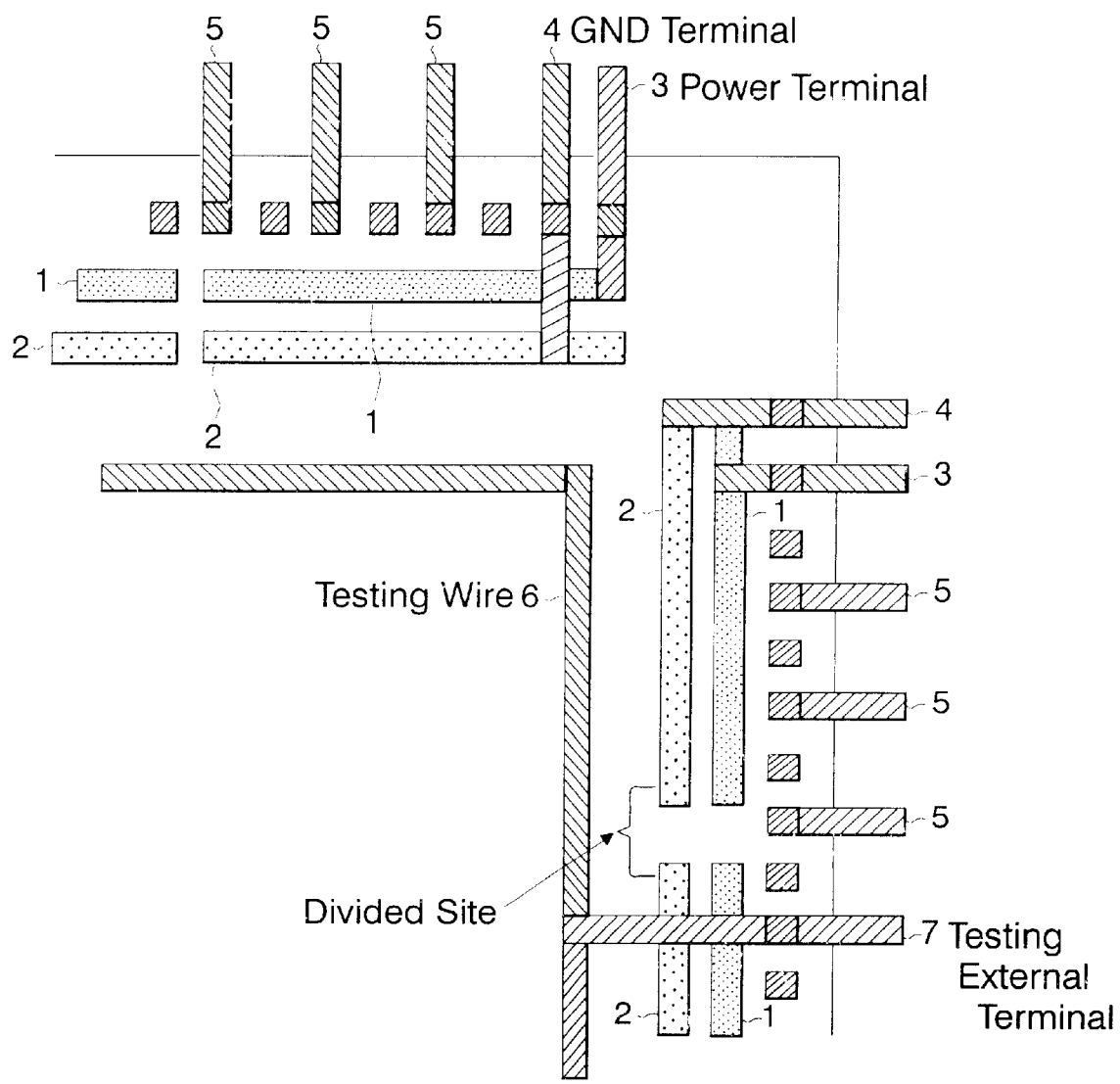
FIG. 2 is an explanatory drawing for a testing circuit for a semiconductor device according to this invention.

Furthermore, as shown in FIG. 2, a testing wire 6 is placed near the power wires 1 and the GND wires 2. The testing wire 6 is connected to an external equipment through a testing external terminal 7.

Figure 3:
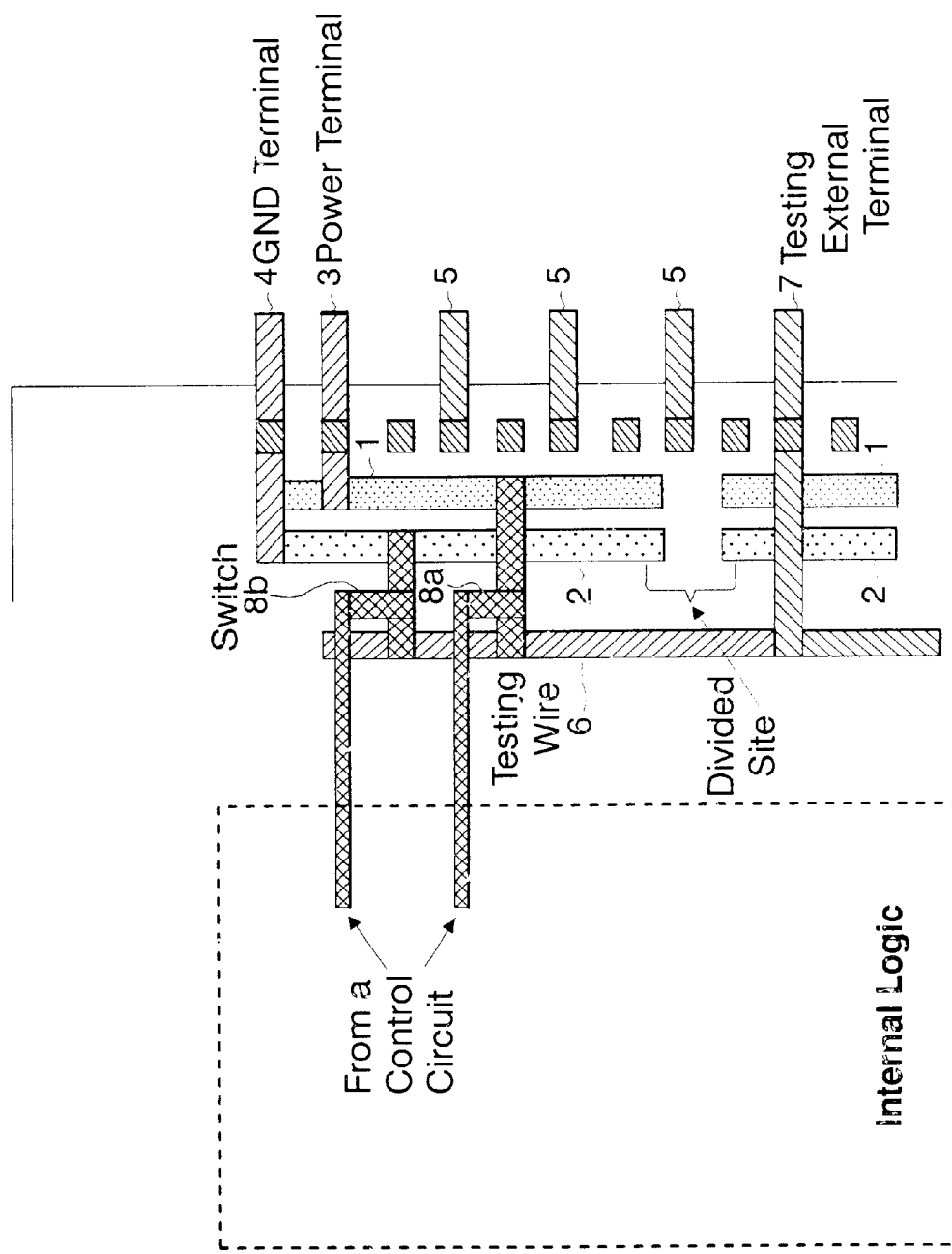
FIG. 3 is an explanatory drawing for a testing circuit for a semiconductor device according to this invention.

The testing wire 6 is, as shown in FIG. 3, connected to a separated power wire 1 and GND 2 through switches 8a and 8b, respectively. The switches are controlled by an internal control circuit. The internal control circuit (semiconductor circuit) for controlling the switches is designed to permit both of the separated power wire 1 and GND wire 2 to be well controlled.

Operation of the testing circuit in this embodiment will be described.

Figure 4:
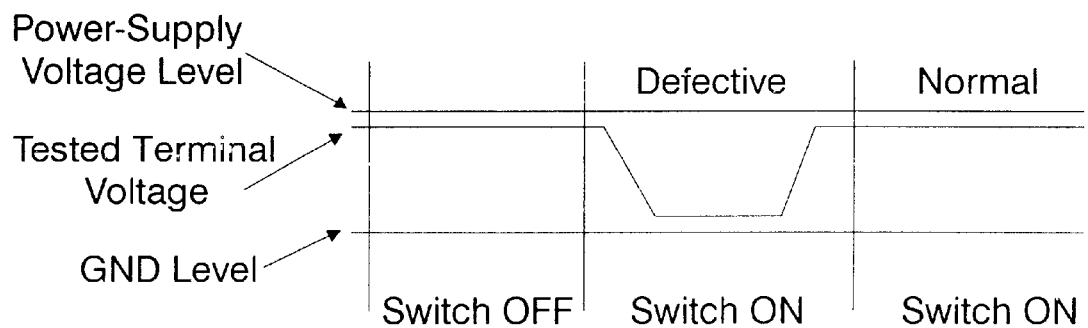
FIG. 4 is an explanatory drawing for a testing circuit for a semiconductor device according to this invention and a testing procedure with it.

When a Tested Terminal is a Power Terminal;

A grounded capacitor is connected to the testing external terminal 7. The switch 8a between the tested power wire 1 and the testing wire 6 is turned ON for making a short circuit. The switches except one for the power wire 1 connected to the tested power terminal 3 are OFF not to affect measurement. A potential of the testing external terminal is measured. When the power terminal 3 to be tested is correctly connected, a voltage of the testing external terminal 7 indicates a value after subtracting a voltage drop due to the semiconductor device itself. When incorrectly connected, a voltage observed is at the GND level (see FIG. 4).

When a Tested Terminal is a GND Terminal;

A given voltage is applied to the testing external terminal 7. The switch 8b between the tested GND wire 2 and the testing wire 6 is turned ON for making a short circuit. The switches except one for the tested GND wire 2 are OFF not to affect measurement.

Figure 5:
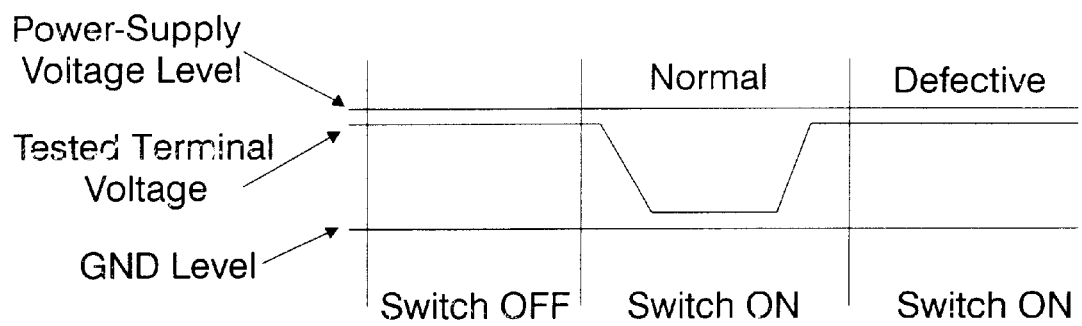
FIG. 5 is an explanatory drawing for another testing circuit for a semiconductor device according to this invention and a testing procedure with it.

A potential of the testing external terminal is measured. When the GND terminal 4 to be tested is correctly connected, a voltage of the testing external terminal is at the GND level. When incorrectly connected, an indicated voltage is equal to the applied voltage (see FIG. 5).

EXAMPLE

The following examples will specifically illustrate this invention.

Example 1

In a semiconductor device, the numbers of power, GND and signal terminals are N, M and L, respectively. The operation voltage of the semiconductor device is 3.3 V.

The power ring is divided into N parts, each of which will drive L/N signal terminals, in a manner that any part retains a sufficient power to drive assigned terminals. The GND ring is divided into M parts, each of which will drive L/M signal terminals, in a manner that any part retains a sufficient power to drive assigned terminals. These are also divided, taking the physical arrangement of the power and the GND terminals into account.

Then, a testing ring is placed inside from the power and the GND rings, and connected to the rings through switches. The switches are controlled by a control circuit provided in the semiconductor device.

The control circuit has a circuitry which may serially turn N+M control signals ON, and has a control terminal for its operation.

The testing external terminal may be alternatively connected to an external capacitor grounded to GND or the power terminal. When testing a power terminal, the testing external terminal is connected to the grounded capacitor to allow a potential of the testing external terminal to be determined. When testing a GND terminal, the testing external terminal is connected to the power terminal to allow a potential of the testing external terminal to be determined.

Next, operation of the testing circuit of this example will be described.

Testing Power Terminals

The testing external terminal is connected to the grounded capacitor, adjusting the setting to permit the control circuit to be operated. Thus, the switch connecting the testing ring with the tested power ring is turned ON by a signal from the control circuit to make a short circuit. Then, a potential of the testing external terminal is determined with a voltmeter.

When the switch is OFF, no voltage is applied to the testing ring. An indicated voltage is, therefore, one generated in the grounded capacitor, which is substantially at the GND level.

When the switch is ON and the tested power terminal is correctly connected, the testing ring makes a short circuit with the power terminal and a voltage applied to the testing external terminal is equal to that applied to the power terminal.

When the switch is ON and the tested power terminal is incorrectly connected, the status is the same as that when the switch is OFF. A substantially GND level of voltage is, therefore, indicated.

The above procedure may be repeated N times to test all the power terminals corresponding to the power wires divided into N parts.

Testing GND Terminals

The testing external terminal is connected with the capacitor connected with the power terminal, adjusting the setting to permit the control circuit to be operated. Thus, the switch connecting the testing ring with the tested GND ring is turned ON by a signal from the control circuit to make a short circuit. Then, a potential of the testing external terminal is determined with a voltmeter.

When the switch is OFF, the testing ring is applied a voltage equal to that to the power terminal, indicating a value substantially equal to the applied voltage.

When the switch is ON and the tested GND terminal is correctly connected, the testing ring makes a short circuit with the GND terminal and a voltage applied to the testing external terminal is substantially equal to that applied to the GND terminal.

When the switch is ON and the tested GND terminal is incorrectly connected, the status is the same as that when the switch is OFF. A voltage substantially equal to that of the power terminal is, therefore, indicated.

The above procedure may be repeated M times to test all the GND terminals corresponding to the power wires divided into M parts.

Example 2

In a semiconductor device, the numbers of power, GND and signal terminals are N, M and L, respectively. The operation voltage of the semiconductor device is 3.3 V.

The power ring is divided into N parts, each of which will drive L/N signal terminals, in a manner that any part retains a sufficient power to drive assigned terminals. The GND ring is divided into M parts, each of which will drive L/M signal terminals, in a manner that any part retains a sufficient power to drive assigned terminals. These are also divided, taking the physical arrangement of the power and the GND terminals into account.

Then, a testing ring is placed inside from the power and the GND rings, and connected to the rings through switches. The switches are controlled by an internal circuit having a circuitry by which N+M control signals are serially turned ON as described in Example 1.

The testing external terminal is connected to a power source which may generate a given voltage. When testing a power terminal, a voltage applied to the testing external terminal is lower than that of the power terminal to determine a potential of the testing external terminal. When testing a GND terminal, a voltage applied to the testing external terminal is in the vicinity of the potential of the power terminal, to determine a potential of the testing external terminal.

Subsequently, the power and the GND terminals are separately tested as described in Example 1.

For testing a power terminal, when the switch is OFF, no voltage is applied to the testing ring, and therefore the given low voltage of the testing power source is measured. When the switch is ON and the tested power terminal is correctly connected, the testing ring makes a short circuit with the power terminal and a voltage applied to the testing external terminal is equal to that applied to the power terminal. When the switch is ON and the tested power terminal is incorrectly connected, the status is the same as that when the switch is OFF. An indicated voltage is, therefore, substantially equal to the given low voltage.

For testing a GND terminal, when the switch is OFF, the testing ring is applied the voltage of the testing power source, to indicate a value in the vicinity of the voltage of the power terminal. When the switch is ON and the tested GND terminal is correctly connected, the testing ring makes a short circuit with the GND terminal and a voltage applied to the testing external terminal is substantially equal to that applied to the GND terminal. When the switch is ON and the tested GND terminal is incorrectly connected, the status is the same as that when the switch is OFF, to indicate a value in the vicinity of the voltage of the power terminal.

What is claimed is:

1. A testing circuit for a semiconductor device comprising:
   a plurality of individual power terminals;
   a plurality of power wires, each of which is divided into a plurality of parts which correspond to the individual power terminals;
   a testing external terminal;
   a testing wire connected to the testing external terminal, said testing wire being separated from an internal logic circuit on the semiconductor device;
   a plurality of switches placed between the testing wire and the power wires, said switches, when closed, connecting the testing wire to the power wire and the individual power terminal which is to be tested, and creating a short between the testing external terminal and the individual power terminal;
   a control circuit for selecting one of the switches to close the testing circuit, in response to a test signal, where said testing circuit tests an individual power terminal of the internal logic circuit in a semiconductor device.

2. A semiconductor device into which a testing circuit according to claim 1 is built.

3. A testing circuit for a semiconductor device comprising:
   a plurality of individual GND terminals;
   a plurality of GND wires, each of which is divided into a plurality of parts which correspond to the individual GND terminals;
   a testing external terminal;
   a testing wire connected to the testing external terminal, said testing wire being separated from an internal logic circuit on the semiconductor device;
   a plurality of switches placed between the testing wire and the GND wires, said switches, when closed, connecting the testing wire to the GND wire and the individual GND terminal which is to be tested, and creating a short between the testing external terminal and the individual GND terminal;
   a control circuit for selecting one of the switches to close the testing circuit, in response to a test signal, where said testing circuit tests an individual GND terminal of the internal logic circuit in a semiconductor device.

4. A semiconductor device into which a testing circuit according to claim 3 is built.

5. A testing circuit for a semiconductor device comprising:
   a plurality of individual power terminals;
   a plurality of power wires, each of which is divided into a plurality of parts which correspond to the individual power terminals;
   a plurality of individual GND terminals;
   a plurality of GND wires, each of which is divided into a plurality of parts which correspond to the individual GND terminals;
   a testing external terminal;
   a testing wire connected to the testing external terminal, said testing wire being separated from an internal logic circuit on the semiconductor device; a plurality of switches placed between the testing wire and the GND wires or between the testing wire and the power wires, or optionally both, said switches, when closed, connecting the testing wire to the GND wire or the power wire and the individual GND or power terminal which is to be tested, and creating a short between the testing external terminal and the individual GND terminal or power terminal;

a control circuit for selecting one of the switches to close the testing circuit, in response to a test signal, where the testing circuit tests an individual power or GND terminal of the internal logic circuit in a semiconductor device, and said power terminal and said GND terminal being separated from the internal logic circuit by the short created by the closed switch.

6. A semiconductor device into which a testing circuit according to claim 4 is built.

7. A testing process for a semiconductor device into which a testing circuit according to claim 5 is built, comprising, when testing a power terminal as the external terminal, the steps of applying a lower voltage to the testing external terminal than that to the power terminal and closing a selected switch corresponding the tested power terminal by the control circuit while measuring a potential of the tested external terminal, which are repeated for individual power terminals; and when testing a GND terminal as the external terminal, the steps of applying a voltage to the testing external terminal and closing a selected switch corresponding the tested GND terminal by the control circuit while measuring a potential of the tested external terminal, which are repeated for individual GND terminals.

* * * * *